United States Patent [19]
Tanaka et al.

[11] Patent Number: 5,439,875
[45] Date of Patent: Aug. 8, 1995

[54] PROCESS FOR PREPARING JOSEPHSON JUNCTION DEVICE HAVING WEAK LINK OF ARTIFICIAL GRAIN BOUNDARY

[75] Inventors: So Tanaka; Hiroshi Inada; Michitomo Iiyama, all of Osaka, Japan

[73] Assignee: Sumitomo Electric Industries, Ltd., Osaka, Japan

[21] Appl. No.: 337,413

[22] Filed: Nov. 7, 1994

Related U.S. Application Data

[62] Division of Ser. No. 983,432, Dec. 2, 1992, abandoned.

[30] Foreign Application Priority Data

Dec. 2, 1991 [JP] Japan .................. 3-343941
Dec. 6, 1991 [JP] Japan .................. 3-348969
Dec. 9, 1991 [JP] Japan .................. 3-350303
Nov. 12, 1992 [JP] Japan .................. 4-327399

[51] Int. Cl.$^6$ .......................... B44C 1/22; C23F 1/00
[52] U.S. Cl. .................... 505/329; 156/647; 156/654; 156/659.1; 156/667; 505/820; 505/922; 505/410; 505/729
[58] Field of Search .............. 257/33; 156/643, 647, 156/654, 659.1, 667; 204/192.24; 505/1, 702, 729, 820, 922; 427/62, 63

[56] References Cited

U.S. PATENT DOCUMENTS 5,157,466 10/1992 Char et al. .................. 257/33

FOREIGN PATENT DOCUMENTS 62-273782 11/1987 Japan .
9216974 10/1992 WIPO .

OTHER PUBLICATIONS

Applied Physics Letters, vol. 59, No. 17, 21 Oct. 1991 pp. 2177-2179 Char K. et al., "Extension of the bi--epitaxial Josephson Junction Process to Various Substrates".

Applied Physics Letters, vol. 59, No. 6, 5 Aug. 1991, pp. 733-735, K. Char et al., "Bi-epitaxial grain boundary junctions in YBa2Cu307".

IEEE Transactions on Magnetics, vol. 27, No. 2, Mar. 1991, pp. 3320-3323, Suzuki et al., "Josephson effect and small-angle grain boundary in YBCO thin film bridge" & Applied Superconductivity Conference, 24 Sep. 1990 Snowmass pp. 3320-3321.

Physica C. vol. 190, No. 2, Dec. 1991 pp. 75-78, Suzuki et al. "Natural and artificial grain boundaries of YBCO thin films for Josephson junctions".

Proceedings of the SPIE, vol. 1477, 1991, pp. 205-208, Bourne et al. "High Temperature Superconducting Josephson Mixers from deliberate grain boundaries in Tl2CaBa2Cu208".

*Primary Examiner*—William Powell
*Attorney, Agent, or Firm*—Kerkam, Stowell, Kondracki & Clarke; John C. Kerins

[57] ABSTRACT

A Josephson junction device comprises a single crystalline substrate including a principal surface having a first and a second regions of which at least lattice distance of exposed lattices are slightly different from each other and an oxide superconductor thin film formed on the principal surface of the substrate. The oxide superconductor thin film includes a first and a second portions respectively positioned on the first and the second regions of the substrate, which are constituted of single crystals of the oxide superconductor, lattices of the one shifts at angle of 45° to that of the other, and a grain boundary between said two portions, which constitutes a weak link of the Josephson junction.

4 Claims, 3 Drawing Sheets

PROCESS FOR PREPARING JOSEPHSON JUNCTION DEVICE HAVING WEAK LINK OF ARTIFICIAL GRAIN BOUNDARY

This application is a division of application Ser. No. 07/983,432, filed Dec. 2, 1992, now abandoned.

BACKGROUND OF THE INVENTION

1. Field of the Invention

The present invention relates to a Josephson junction device having weak link of artificial grain boundary and a process for preparing the Josephson junction device, and more specifically to a Josephson junction device of an oxide superconductor, of which the barrier of the weak link is constituted of a grain boundary of two single crystal oxide superconductor regions and a process for preparing the Josephson junction device.

2. Description of Related Art

A Josephson junction device which is one of superconducting devices can be realized in various structures. Among the various structures, the most preferable structure in practice is a stacked junction realized by a thin non-superconductor layer sandwiched between a pair of superconductors. However, a point contact type junction, a Dayem bridge type junction and a variable thickness bridge type junction which are composed of a pair of superconductor regions which are weakly linked to each other also exhibit Josephson effect. In general, these Josephson junctions have fine structures in which the superconductor and/or non-superconductor are composed of thin films.

In order to realize a stacked type junction by using an oxide superconductor, a first oxide superconductor thin film, a non-superconductor thin film and a second oxide superconductor thin film are stacked on a substrate in the named order.

In the above mentioned stacked type junction, an insulator MgO etc., a semiconductor Si etc., and a metal Au etc. are used for the non-superconductor layers so that each superconducting junction has different properties for each applications.

The thickness of the non-superconductor layer of the stacked type junction is determined by the coherence length of the superconductor. In general, the thickness of the non-superconductor layer of the stacked type junction must be within a few times of the coherence length of the superconductor. Since oxide superconductor materials have a very short coherence length, therefore, a thickness of a non-superconductor layer must be about a few nanometers.

However, the superconductor layers and the non-superconductor layer of the stacked type junction must be of high crystallinity for favorable junction properties, which are composed of single crystals or composed of polycrystals which are orientated in almost same direction. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is realized, the interfaces between the oxide superconductor layers and the non-superconductor layer are not in good condition so that the stacked type junction does not function in good order.

In order to manufacture a point contact type junction, a Dayem bridge type junction and a variable thickness bridge type junction by using oxide superconductor, very fine processings which realize a weak link of a pair of superconductor are necessary. It is very difficult to conduct a fine processing with good repeatability.

The point contact type junction has been formed of two oxide superconductor thin films which are in contact with each other in a extremely small area which constitutes the weak link of the Josephson junction.

The Dayem bridge type junction has been formed of a constant thickness oxide superconductor thin film which is formed on a substrate and which is patterned in a plan view, so that a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type junction has been formed of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, a characteristics of the Josephson device has a close relation to the contact area of the superconductor thin film in the point contact type Josephson device, the width of the superconductor thin film region having the extremely narrow width in the Dayem bridge type Josephson device, and to the thickness of the thinned oxide superconductor thin film portion in the variable thickness bridge type Josephson device, both of which form the weak link of the Josephson junction. Therefore, in order to obtain a desired characteristics with a good repeatability, a high precision on a sub-micron level of the processing such as the etching is required.

The Dayem bridge type Josephson device can be said to be more preferable than the variable thickness bridge type Josephson device, since the Dayem bridge type Josephson device has a relatively planer surface, which is preferred in a integrated circuit. However, in order to form the weak link in the Dayem bridge type Josephson device, it is required to pattern an oxide superconductor thin film having the thickness on the order of 0.5 μm to 1.0 μm into a width of not greater than 0.2 μm. However, it is very difficult to conduct this fine patterning with good repeatability.

On the other hand, in the variable thickness bridge type Josephson device, the very fine pattering is not required in order to form the weak link. However, it is very difficult to uniformly control the remaining thickness of the thinned portion forming the weak link. In addition, the variable thickness bridge type Josephson device cannot have a planer surface by nature. This is not preferable to the integrated circuit application.

Therefore, in the prior art, it is almost impossible to manufacture a superconducting device for example a dc SQUID (superconducting quantum interference device) which has multiple homogeneous Josephson junctions utilizing an oxide superconductor.

In order to resolve the above mentioned problems, researches have been conducted to manufacture a Josephson junction device taking account of the characteristics advantage intrinsic to the oxide superconductor, permitting it to avoid the fine processing of the oxide superconductor.

The superconducting characteristics of the oxide superconductor considerably varies, depending on the crystalline direction. Particularly, the oxide superconductor has a large critical current density in the direction perpendicular to the c-axes of its crystals. Thus, if the oxide superconductors having crystalline directions different from each other are joined together, a grain boundary at the interface becomes a barrier of the weak link so that a Josephson junction is formed. A Josephson junction device utilizing this Josephson junction is called artificial grain boundary type Josephson junction device. A Josephson junction device of this type can be manufactured without the fine processing as mentioned above.

In order to manufacture the artificial grain boundary type Josephson junction device, in a prior art, the same two substrates were joined so as to form a substrate of which the crystalline directions of each sides were different from each other. Then, an oxide superconductor thin film was deposited thereon so as to form an oxide superconductor thin film having different crystalline directions in both sides. However, according to the process, it was difficult to join the substrates having different crystalline directions and particularly the junction interface was not sharp so that the artificial barrier forming the weak link of the Josephson junction device could not be formed sharply.

In another prior art, a specific buffer layer was formed on a portion of the substrate and an oxide superconductor thin film was deposited thereon. A portion of the oxide superconductor thin film which grew on the buffer layer had a crystalline orientation different from that of the other portion of the oxide superconductor thin film which grew directly on the substrate. In this process, there are very few buffer layer materials which have these characteristics and which does not affect the oxide superconductor at all. In addition, buffer layer patterning process might affect the principal surface of the substrate on which the oxide superconductor thin film is deposited.

SUMMARY OF THE INVENTION

Accordingly, it is an object of the present invention to provide a Josephson junction device including a weak link of the Josephson junction composed of an oxide superconductor material and planar surface, which have overcome the above mentioned defects of the conventional ones.

Another object of the present invention is to provide a method for manufacturing a Josephson junction device with good repeatability by using already established processing techniques.

The above and other objects of the present invention are achieved in accordance with the present invention by a Josephson junction device comprising a single crystalline substrate including a principal surface having a first and a second regions of which at least lattice distance of exposed lattices are slightly different from each other, and an oxide superconductor thin film formed on the principal surface of the substrate, which includes a first and a second portions respectively positioned on the first and the second regions of the substrate, which are constituted of single crystals of the oxide superconductor, lattices of the one shifts at angle of 45° to that of the other and a grain boundary between said two portions, which constitutes a weak link of the Josephson junction.

In a preferred embodiment, the oxide superconductor thin film is a c-axis orientated oxide superconductor thin film. In this case, the a-axes and the b-axes of the oxide superconductor crystals which constitute the first portion of the oxide superconductor thin film shifts at an angle of 45° to those of the second portion of the oxide superconductor thin film.

In a preferred embodiment, a step is formed on the principal surface of the substrate between the first and second regions. In this case, the grain boundary which constitutes the weak link of Josephson junction is positioned at the step portion.

The substrate is preferably formed of MgO and it is preferable that the Josephson junction device further comprises $SrTiO_3$ buffer layer which constitutes one of the first and second regions of the principal surface of the substrate.

In a preferred embodiment, the oxide superconductor is formed of high-$T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

According to another aspect of the present invention, there is provided a method for manufacturing a Josephson junction device comprising the steps of wet-etching at least a portion of a principal surface of the single crystalline substrate so that the principal surface includes a first and a second regions of which at least lattice distance of exposed lattices are slightly different from each other and forming an oxide superconductor thin film on the first and second regions of the principal surface so that the oxide superconductor thin film includes a first and a second portions respectively positioned on the first and the second regions of the substrate, which are constituted of single crystals of the oxide superconductor, lattices of the one shifts at angle of 45° to that of the other, and a grain boundary between said two portions, which constitutes a weak link of the Josephson junction.

The substrate is preferably formed of MgO single crystalline substrate, since the lattice distance of MgO crystals varies when they are wet-etched by HCl or $H_3PO_4$.

In a preferred embodiment, the method comprises steps of wet-etching a portion of the principal surface of the substrate so as to form a step, a first and a second regions of which lattice distance of exposed lattices are slightly different from each other at the both sides of the step.

In another preferred embodiment, the method comprises steps of wet-etching the principal surface of the substrate, dry-etching a portion of the wet-etched principal surface in order to remove a surface of the portion so as to form a first and a second regions on the principal surface of the substrate, of which lattice distance of exposed lattices are slightly different from each other.

In still another preferred embodiment, the method comprises the steps of etching a portion of a principal surface of MgO single crystal substrate so as to form a step, forming a layer of material other than MgO which can be a base of an oxide superconductor thin film only at a portion below the step so that the principal surface is substantially planarized, wet-etching the principal surface of the substrate so as to form a first and a second regions of which lattice distance of exposed lattices are slightly different from each other.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1D, a first embodiment of the process in accordance with the present invention for manufacturing the Josephson device in accordance with the present invention will be described.

Figure 1A:
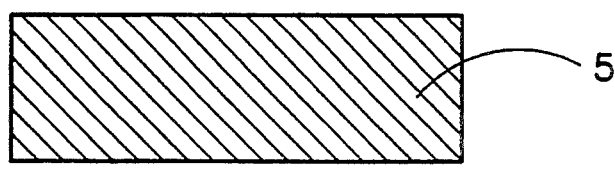
FIGS. 1A to 1D are diagrammatic views for illustrating a first embodiment of the process for manufacturing the Josephson junction device in accordance with the present invention.

As shown in FIG. 1A, an MgO (100) single crystalline substrate 5 having a substantially planar principal surface ((100) surface) was prepared.

Figure 1B:
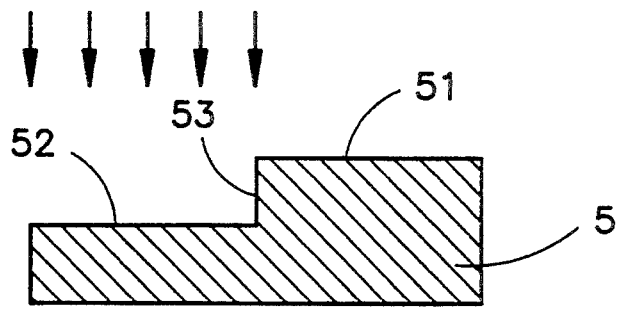

Then, a left half portion of the principal surface of the MgO(100) substrate 5 was wet-etched by $H_3PO_4$ so as to form a step portion 53, as shown in FIG. 1B. The step portion 53 had a height of not less than 50 nanometers. After the etching, the lattices distance of MgO crystals exposed on the surface of the wet-etched region 52 of the principal surface of the substrate 5 was slightly changed in such a way that a thin film having a different crystalline direction from that of the MgO crystals was able to grow epitaxially on the region 52.

Figure 1C:
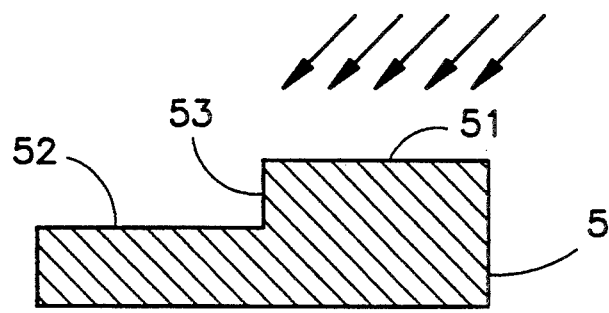

Thereafter, as shown in FIG. 1C, in order to eliminate contamination adhered to the region 51, the substrate 5 was irradiated by Ar ions obliquely from the side of the region 51 of the principal surface of the substrate 5. The Ar ions were irradiated at an angle as shallow as possible so that the surface of the region 52 was not etched. Then, the substrate 5 was heated up to 350° to 400° C. under a pressure lower than $1 \times 10^{-9}$ Torr to clean up the regions 51 and 52 of the substrate 5.

Figure 1D:
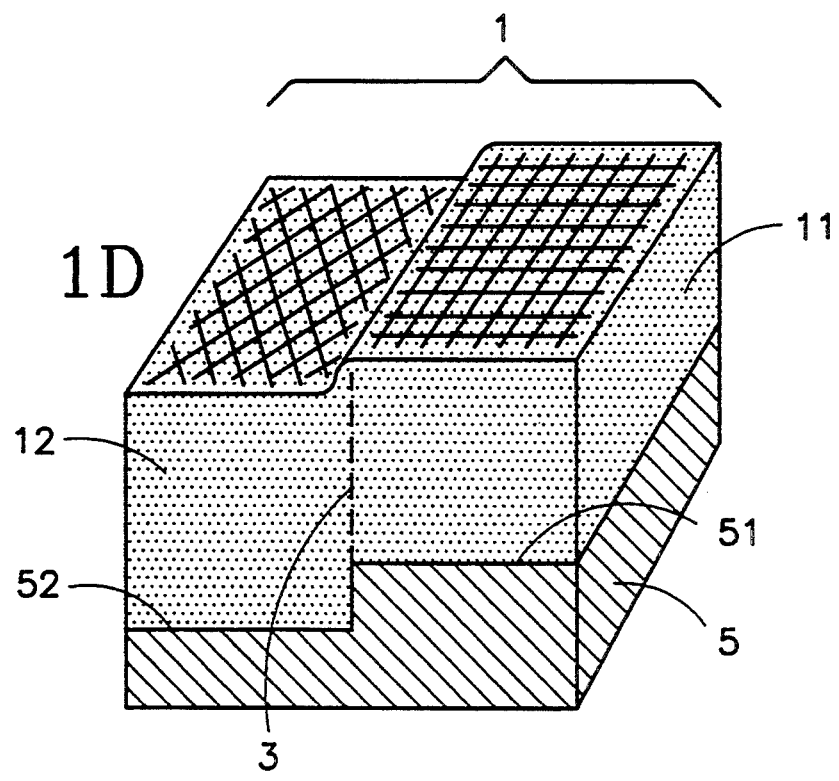

Thereafter, as shown in FIG. 1D, a $Y_1Ba_2Cu_3O_{7-x}$ oxide superconductor thin film I having a thickness of 300 nanometers was deposited over the regions 51 and 52 of the substrate 5 by a sputtering process. The conditions of the sputtering process were as follows;

| | | |
|---|---|---|
| Temperature of substrate | | 700° C. |
| Sputtering gas | Ar | 9 sccm (90%) |
| | $O_2$ | 1 sccm (10%) |
| Pressure | | $7.5 \times 10^{-2}$ Torr |

The a-axes and b-axes of lattices of a portion 12 of the c-axis orientated $Y_1Ba_2Cu_3O_{7-x}$ oxide superconductor thin film 1, which grew on the wet-etched region 52 shifted at angle of 45° to those of a portion 11 of the $Y_1Ba_2Cu_3O_{7-x}$ oxide superconductor thin film 1, which grew on the non-etched region 51. A grain boundary 3 was created at the interface between the portions 11 and 12, which was just on the step portion 53. The portions 11 and 12 of the $Y_1Ba_2Cu_3O_{7-x}$ oxide superconductor thin film 1 were linked weakly by the grain boundary 3 so that the Josephson junction, where the superconducting electrodes were constituted of the portions 11 and 12 of the $Y_1Ba_2Cu_3O_{7-x}$ oxide superconductor thin film 1 and the weak link was constituted of the grain boundary 3, was formed. The $Y_1Ba_2Cu_3O_{7-x}$ oxide superconductor thin film 1 could be etched so as to form the narrow portion between portions 11 and 12, the center of which the grain boundary 3 crossed. Metal electrodes might be formed on the portions 11 and 12, if necessary. With this, the Josephson junction device in accordance with the present invention was completed.

A current-voltage characteristics of the above mentioned Josephson junction device was measured at a temperature of 85 K. When a microwave was irradiated, clear Shapiro steps was observed, and therefore, it could be ascertained that the Josephson junction was realized in the device.

As explained above, the Josephson junction device manufactured in accordance with the first embodiment of the method of the present invention is composed of two superconducting electrodes of single-crystalline oxide superconductor, which grow at the same time and form a sheet of the oxide superconductor thin film and which have a crystalline direction different at angle of 45° from each other, and a weak link of a grain boundary between them. The weak link of the Josephson junction device is formed of a self-generated grain boundary. Accordingly, the limitation in the fine processing technique required for manufacturing the Josephson junction device is relaxed.

Embodiment 2

Referring to FIGS. 2A to 2F, a second embodiment of the process for manufacturing the superconducting device will be described.

Figure 2A:
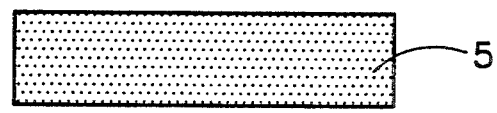
FIGS. 2A to 2F are diagrammatic views for illustrating a second embodiment of the process for manufacturing the Josephson junction device in accordance with the present invention.
Figure 2B:
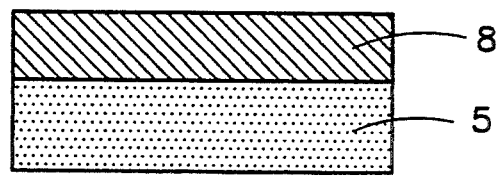

As shown in FIG. 2A, an MgO (100) substrate similar to that of Embodiment 1 was prepared. In this embodiment the MgO (100) substrate had a size of 15 mm × 8 mm and a thickness of 0.5 mm. As shown in FIG. 2B, a mask layer 8 of $Pr_1Ba_2Cu_3O_{7-y}$, sufficiently thick, for example, having a thickness of about 750 to 1500 nanometers, was formed on the substrate 5 by a sputtering process. The conditions of the sputtering process were as follows;

| | | |
|---|---|---|
| Temperature of substrate | | 750° C. |
| Sputtering gas | Ar | 9 sccm (90%) |
| | $O_2$ | 1 sccm (10%) |
| Pressure | | $5 \times 10^{-2}$ Torr |
| Thickness of film | | 800 nanometers |

The mask layer 8 can be formed of any material which can constitute an effective mask against ion beam etching. For example, Nb is preferable, other than $Pr_1Ba_2Cu_3O_{7-y}$.

Figure 2C:
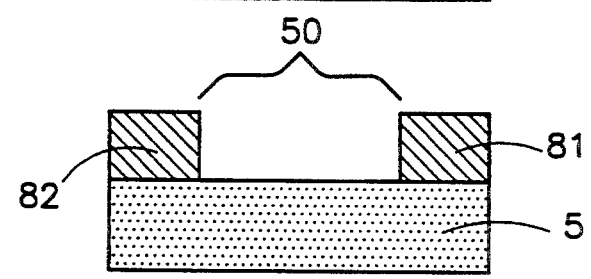

Then, as shown in FIG. 2C, a center portion of the $Pr_1Ba_2Cu_3O_{7-y}$ mask layer 8 was removed by an ion milling using Ar-ions so that a portion of the surface 50 having a width of 3.0 μm was exposed at the center of the substrate 5 and mask layers 81 and 82 were arranged at the both sides of the exposed surface 50.

Figure 2D:
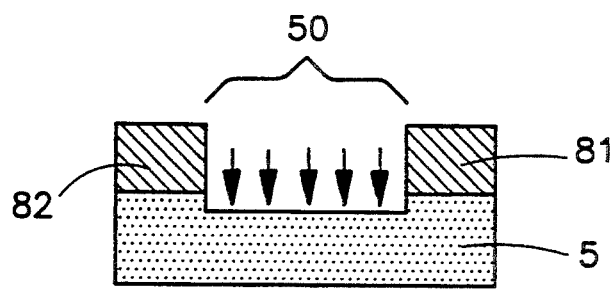

Thereafter, as shown in FIG. 2D, the exposed surface 50 of the substrate was wet-etched about 50 nanometers thick from the surface by $H_3PO_4$. By this etching process, the lattice distance of MgO crystals exposed on the surface 50 of the substrate 5 was slightly changed in such a way that a thin film having a different crystalline direction from that of the MgO crystals was able to grow epitaxially on the region 50.

Figure 2E:
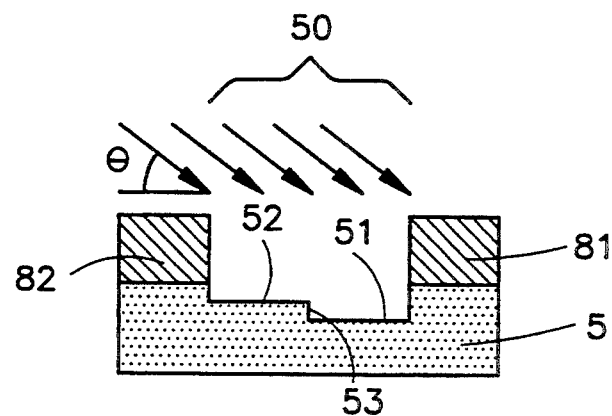

Then, as shown in FIG. 2E, a portion 51 of the region 50 was etched by a dry etching process using an Ar ion beam so that MgO crystalline latices which were not affected by the wet-etching were exposed. In order to remove the surface portion of only the portion 51, the Ar ion beam was irradiated so as to form an angle θ of 30° with respect to the surface of the substrate. It is preferred that the incline angle θ of the ion beam is adequately determined by the thickness of the formed mask layers 81 and 82 and the border line portion between the portions 51 and 52.

Then, the substrate 5 was heated at a temperature of 350° to 400° C. for one hour under a high vacuum of about $1 \times 10^{-10}$ Torr so as to clean the surface portions 51 and 52 of the substrate 5. Thereafter, a c-axis orientated $Y_1Ba_2Cu_3O_{7-x}$ oxide superconductor thin film 1 having a thickness of 250 nanometers was deposited on the substrate 5 by a sputtering. The conditions of the sputtering were as follows;

| Temperature of substrate | | 700° C. |
|---|---|---|
| Sputtering gas | Ar | 9 sccm (90%) |
| | $O_2$ | 1 sccm (10%) |
| Pressure | | $5 \times 10^{-2}$ Torr |

Figure 2F:
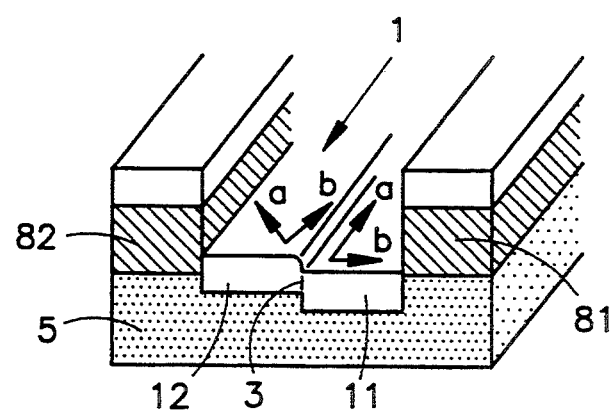

The direction of crystalline lattices of a portion 11 of the c-axis orientated $Y_1Ba_2Cu_3O_{7-x}$ oxide superconductor thin film 1 coincided with that of the MgO crystalline lattices of the substrate 5. On the contrary, the a-axes and b-axes of lattices of a portion 12 of the c-axis orientated $Y_1Ba_2Cu_3O_{7-x}$ oxide superconductor thin film 1, which grew on the portion 52 shifted at angle of 45° to those of the portion 11 of the $Y_1Ba_2Cu_3O_{7-x}$ oxide superconductor thin film 1, as shown in FIG. 2F. A grain boundary 3 was created at the interface between the portions 11 and 12, which was just on the step portion 53. The portions 11 and 12 of the $Y_1Ba_2Cu_3O_{7-x}$ oxide superconductor thin film 1 were linked weakly by the grain boundary 3 so that the Josephson junction, where the weak link was constituted of the grain boundary 3, was formed. The $Y_1Ba_2Cu_3O_{7-x}$ oxide superconductor thin film 1 could be etched so that the narrow portion, on the center portion of which the grain boundary 3 was positioned, was created between portions 11 and 12. Metal electrodes might be formed on the portions 11 and 12, if necessary. With this, the Josephson junction device in accordance with the present invention was completed.

A current-voltage characteristics of the above mentioned Josephson junction device was measured at a temperature of 85 K. When a microwave was irradiated, clear Shapiro steps was observed, and therefore, it could be ascertained that the Josephson junction was realized in the device.

As explained above, the Josephson junction device manufactured in accordance with the second embodiment of the method of the present invention is composed of two superconducting electrodes of single-crystalline oxide superconductor, which grow at the same time and form a sheet of the oxide superconductor thin film and which have a crystalline direction different at angle of 45° from each other, and a weak link of a grain boundary between them. The weak link of the Josephson junction device is formed of a self-generated grain boundary. Accordingly, the limitation in the fine processing technique required for manufacturing the Josephson junction device is relaxed.

Embodiment 3

Referring to FIGS. 3A to 3F, a third embodiment of the process for manufacturing the superconducting device will be described.

Figure 3A:
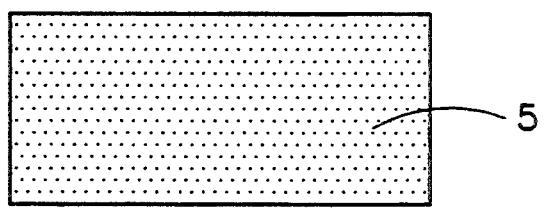
FIGS. 3A to 3F are diagrammatic views for illustrating a third embodiment of the process for manufacturing the Josephson junction device in accordance with the present invention.

As shown in FIG. 3A, an MgO (100) substrate 5 having a size of 15 mm×8 mm and a thickness of 0.5 mm, similar to those of Embodiments 1 and 2 was prepared.

Figure 3B:
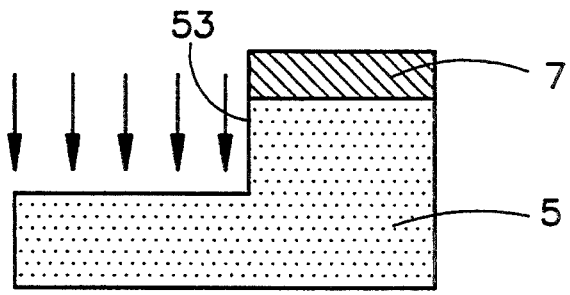

Then, as shown in FIG. 3B, after covering a part of the substrate 5 with a photoresist 7, the substrate 5 was etched by an ion milling so that a step 53 having a height of 200 nanometers was formed.

Figure 3C:
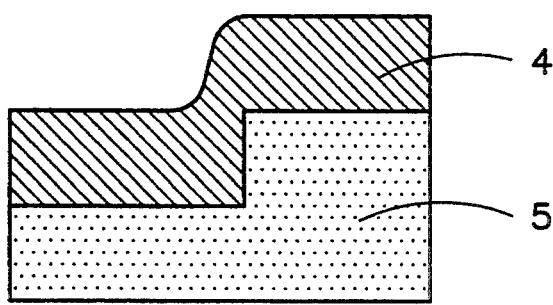

Thereafter, as shown in FIG. 3C, the substrate 5 was cleaned up by a reverse sputtering process and a $SrTiO_3$ thin film 4 having a thickness of 300 nanometers was deposited on the whole surface of the substrate 5 by a sputtering. The conditions of the sputtering were as follows;

| Temperature of substrate | | 350° C. |
|---|---|---|
| Sputtering gases | Ar | 9 sccm |
| Pressure | | $5 \times 10^{-2}$ Torr |

The direction of crystalline lattices of the $SrTiO_3$ thin film 4 coincided with that of MgO crystalline lattices of the substrate 5.

Figure 3D:
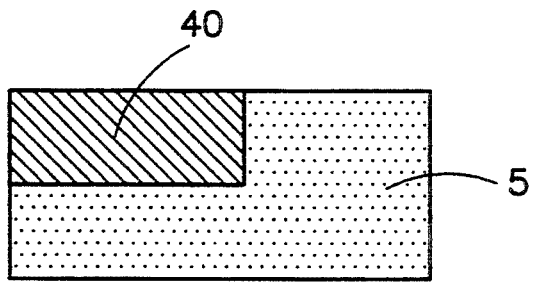

Then, as shown in FIG. 3D, the whole surface of the substrate 5 was etched back by an ion milling process so that the surface was planarized. By this, two regions, that is, a region in which MgO (100) surface was directly exposed and a region covered with the $SrTiO_3$ layer 40 were formed on the surface of the substrate 5.

Figure 3E:
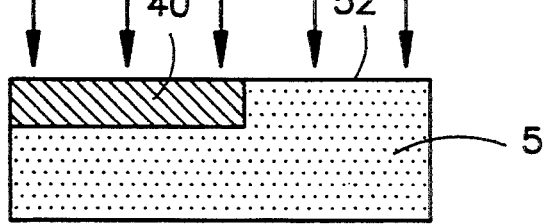

Thereafter, as shown in FIG. 3E, the whole surface of the substrate 5 with the $SrTiO_3$ layer 40 was wet-etched by $H_3PO_4$. This etching process was limited to the wet-etching process and the surface of the substrate 5 was etched more than 50 nanometers thick. By this etching process, the lattice distance of MgO crystals exposed on the surface 52 of the substrate 5 was changed in such a way that a thin film having a different crystalline direction from that of the MgO crystals and also the $SrTiO_3$ layer 40 was able to grow epitaxially on the region 52.

Figure 3F:
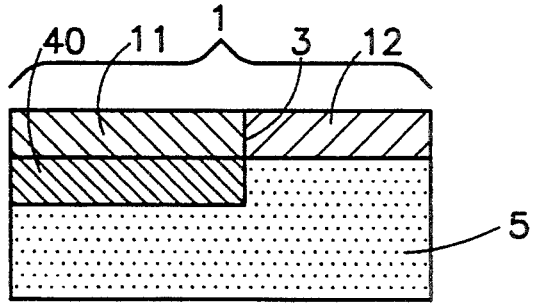

Finally, as shown in FIG. 3F, a $Y_1Ba_2Cu_3O_{7-x}$ oxide superconductor thin film 1 having a thickness of 300 nanometers was deposited on the substrate 5 by a sputtering. The conditions of the deposition were as follows;

| | | |
|---|---|---|
| Temperature of substrate | | 700° C. |
| Sputtering gas | Ar | 9 sccm (90%) |
| | O₂ | 1 sccm (10%) |
| Pressure | | 5 × 10⁻² Torr |

The direction of crystalline lattices of a portion 11 of the c-axis orientated $Y_1Ba_2Cu_3O_{7-x}$ oxide superconductor thin film 1 coincided with that of the $SrTiO_3$ crystalline lattices of the $SrTiO_3$ thin film 40 and also MgO crystals. On the contrary, the a-axes and b-axes of lattices of a portion 12 of the c-axis orientated $Y_1Ba_2Cu_3O_{7-x}$ oxide superconductor thin film 1, which grew on the region 52 shifted at angle of 45° to those of the portion 11. A grain boundary 3 was created at the interface between the portions 11 and 12. The portions 11 and 12 of the $Y_1Ba_2Cu_3O_{7-x}$ oxide superconductor thin film 1 were linked weakly by the grain boundary 3 so that the Josephson junction, where the superconducting electrodes were constituted of the portions 11 and 12 of the $Y_1Ba_2Cu_3O_{7-x}$ oxide superconductor thin film 1 and the weak link was constituted of the grain boundary 3, was formed. The $Y_1Ba_2Cu_3O_{7-x}$ oxide superconductor thin film I could be etched so as to form the narrow portion between portions 11 and 12, the center of which the grain boundary 3 crossed. Metal electrodes might be formed on the portions 11 and 12, if necessary. With this, the Josephson junction device in accordance with the present invention was completed.

A current-voltage characteristics of the above mentioned Josephson junction device was measured at a temperature of 85 K. Superconducting current flowed through both of the portion 11 and the portion 12. When a microwave was irradiated, clear Shapiro steps was observed, and therefore, it could be ascertained that the Josephson junction was realized in the device.

As explained above, the Josephson junction device manufactured in accordance with the third embodiment of the method of the present invention is composed of two superconducting electrodes of single-crystalline oxide superconductor, which grow at the same time and form a sheet of the oxide superconductor thin film and which have a crystalline direction different at angle of 45° from each other, and a weak link of a grain boundary between them. The weak link of the Josephson junction device is formed of a self-generated grain boundary. In addition, since the upper surface of the Josephson junction device is planarized, it become easy to form conductor wirings in a later process. Accordingly, the limitation in the fine processing technique required for manufacturing the Josephson junction device or circuit is relaxed.

In the above mentioned embodiments, the oxide superconductor thin film can be formed of not only the Y-Ba-Cu-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A method for manufacturing a Josephson junction device comprising the steps of:

wet-etching at least a portion of a principal surface of a single crystalline substrate so that the principal surface includes a first and a second region, of which at least a lattice distance of an exposed lattice of said first region is slightly different from a lattice distance of an exposed lattice of said second region, and, forming an oxide superconductor thin film on the first and second regions of the principal surface so that the oxide superconductor thin film includes first and second portions respectively positioned on the first and the second regions of the substrate, said first and said second portions of said oxide superconductor thin film being constituted of single crystals of the oxide superconductor, wherein a lattice of said first portion is oriented at an angle of 45° to a lattice of the second portion, and so that the oxide superconductor thin film has a grain boundary between said first and second portions, which constitutes a weak link of the Josephson junction.

2. A method claimed in claim 1 wherein the method comprises steps of wet-etching a portion of the principal surface of the substrate so as to form a step, a first and a second regions of which lattice distance of exposed lattices are slightly different from each other at the both sides of the step and forming an oxide superconductor thin film on the first and second regions of the principal surface so that the oxide superconductor thin film includes a first and a second portions respectively positioned on the first and the second regions of the substrate, which are constituted of single crystals of the oxide superconductor, lattices of the one shifts at angle of 45° to that of the other, and a grain boundary between said two portions, which constitutes a weak link of the Josephson junction.

3. A method claimed in claim 1 wherein the method comprises steps of wet-etching the principal surface of the substrate, dry-etching a portion of the wet-etched principal surface in order to remove a surface of the portion so as to form a first and a second regions on the principal surface of the substrate, of which lattice distance of exposed lattices are slightly different from each other and forming an oxide superconductor thin film on the first and second regions of the principal surface so that the oxide superconductor thin film includes a first and a second portions respectively positioned on the first and the second regions of the substrate, which are constituted of single crystals of the oxide superconductor, lattices of the one shifts at angle of 45° to that of the other, and a grain boundary between said two portions, which constitutes a weak link of the Josephson junction.

4. A method claimed in claim 1 wherein the method comprises the steps of etching a portion of a principal surface of MgO single crystal substrate so as to form a step, forming a layer of material other than MgO which can be a base of an oxide superconductor thin film only at a portion below the step so that the principal surface is substantially planarized, wet-etching the principal surface of the substrate so as to form a first and a second regions of which lattice distance of exposed lattices are slightly different from each other and forming an oxide superconductor thin film on the first and second regions of the principal surface so that the oxide superconductor thin film includes a first and a second portions respectively positioned on the first and the second regions of the substrate, which are constituted of single crystals of the oxide superconductor, lattices of the one shifts at angle of 45° to that of the other, and a grain boundary between said two portions, which constitutes a weak link of the Josephson junction.

\* \* \* \* \*